US012272410B2

(12) United States Patent
Chen et al.

(10) Patent No.: US 12,272,410 B2
(45) Date of Patent: *Apr. 8, 2025

(54) METHOD FOR READING THREE-DIMENSIONAL FLASH MEMORY

(71) Applicant: Yangtze Memory Technologies Co., Ltd., Hubei (CN)

(72) Inventors: Zilong Chen, Hubei (CN); Xiang Fu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/167,645

(22) Filed: Feb. 10, 2023

(65) Prior Publication Data

US 2023/0197170 A1 Jun. 22, 2023

Related U.S. Application Data

(63) Continuation of application No. 17/324,877, filed on May 19, 2021, now Pat. No. 11,600,342, which is a
(Continued)

(51) Int. Cl.
*G11C 16/00* (2006.01)
*G11C 16/04* (2006.01)
(Continued)

(52) U.S. Cl.
CPC ...... *G11C 16/3427* (2013.01); *G11C 16/0483* (2013.01); *G11C 16/08* (2013.01); *G11C 16/26* (2013.01); *H10B 43/27* (2023.02)

(58) Field of Classification Search
CPC ..... G11C 16/0483; G11C 16/08; G11C 16/26; G11C 16/10; G11C 16/32; G11C 16/24;
(Continued)

(56) References Cited

U.S. PATENT DOCUMENTS 8,031,530 B2 10/2011 Joo
8,400,839 B2 3/2013 Li
(Continued)

FOREIGN PATENT DOCUMENTS

CN 101866694 A 10/2010
CN 102760490 A 10/2012
(Continued)

OTHER PUBLICATIONS

International Search Report and Written Opinion of the International Searching Authority directed to related International Patent Application No. PCT/CN2019/112728, mailed Jul. 22, 2020; 6 pages.
(Continued)

*Primary Examiner* — Thong Q Le
(74) *Attorney, Agent, or Firm* — HANLEY, FLIGHT & ZIMMERMAN, LLC (57) ABSTRACT

A method for conducting a read-verification operation on a target memory cell in a three-dimensional (3D) memory device includes removing fast charges of the target memory cell at a read-prepare step and measuring a threshold voltage of the target memory cell at a sensing step. Removing the fast charges of the target memory cell includes applying a prepare voltage ($V_{prepare}$) on an unselected top select gate (Unsel_TSG) of an unselected memory string, applying a first off voltage ($V_{off}$) on a selected word line (Sel_WL) associated with the target memory cell, and applying a pass voltage ($V_{pass}$) on an unselected word line (Unsel_WL).

20 Claims, 8 Drawing Sheets

Related U.S. Application Data continuation of application No. 16/729,838, filed on Dec. 30, 2019, now Pat. No. 11,043,279, which is a continuation of application No. PCT/CN2019/112728, filed on Oct. 23, 2019.

(51) Int. Cl.
*G11C 16/08* (2006.01)
*G11C 16/26* (2006.01)
*G11C 16/34* (2006.01)
*H10B 43/27* (2023.01)

(58) Field of Classification Search
CPC ............ G11C 16/3459; G11C 11/5642; G11C 16/0408; G11C 16/0466; G11C 11/5628; G11C 13/0004; G11C 13/0038; G11C 13/004; G11C 16/04; G11C 16/30; G11C 16/3418; G11C 16/3427; G11C 2207/2209; G11C 8/12; G11C 11/5671; G11C 16/34; G11C 16/3404; G11C 16/3431
See application file for complete search history.

(56) References Cited

U.S. PATENT DOCUMENTS

| | | | |
|---|---|---|---|
| 8,873,288 | B2 | 10/2014 | Sharon et al. |
| 9,093,369 | B2 | 7/2015 | Shin et al. |
| 9,224,492 | B1 | 12/2015 | Watanabe |
| 9,311,993 | B2 * | 4/2016 | Shimura ............ G11C 11/5642 |
| 9,361,993 | B1 | 6/2016 | Chen et al. |
| 9,564,237 | B2 | 2/2017 | Lee et al. |
| 9,589,978 | B1 | 3/2017 | Yip |
| 9,607,707 | B1 | 3/2017 | Pang et al. |
| 9,620,233 | B1 | 4/2017 | Dong et al. |
| 9,666,296 | B1 | 5/2017 | Maejima |
| 9,704,587 | B1 | 7/2017 | Park |
| 10,008,269 | B2 | 6/2018 | Maejima |
| 10,043,583 | B2 | 8/2018 | Nam et al. |
| 10,121,529 | B2 | 11/2018 | Lee |
| 10,121,542 | B2 | 11/2018 | Nam |
| 10,121,554 | B2 | 11/2018 | Harari |
| 10,276,251 | B1 | 4/2019 | Lobana et al. |
| 10,403,637 | B2 | 9/2019 | Lue |
| 10,438,671 | B1 | 10/2019 | Chen et al. |
| 10,748,631 | B2 | 8/2020 | Tsubouchi |
| 10,930,663 | B2 | 2/2021 | Lu et al. |
| 11,043,279 | B2 | 6/2021 | Chen et al. |
| 11,600,342 | B2 * | 3/2023 | Chen .................. G11C 11/5671 |
| 2010/0046300 | A1 | 2/2010 | Sarin et al. |
| 2012/0151301 | A1 | 6/2012 | Izumi et al. |
| 2012/0275223 | A1 | 11/2012 | Baek |
| 2013/0128667 | A1 | 5/2013 | Lee et al. |
| 2013/0339603 | A1 | 12/2013 | Zhu et al. |
| 2014/0241069 | A1 | 8/2014 | Kwak et al. |
| 2015/0003169 | A1 | 1/2015 | Nam et al. |
| 2015/0036426 | A1 | 2/2015 | Kwak et al. |
| 2015/0179269 | A1 | 6/2015 | Lee |
| 2015/0325297 | A1 | 10/2015 | Pang et al. |
| 2016/0035431 | A1 | 2/2016 | Nam et al. |
| 2016/0293271 | A1 | 10/2016 | Won et al. |
| 2016/0300620 | A1 | 10/2016 | Dutta et al. |
| 2016/0372185 | A1 | 12/2016 | Shim et al. |
| 2017/0076813 | A1 | 3/2017 | Kato et al. |
| 2017/0294367 | A1 | 10/2017 | Kitnarong et al. |
| 2018/0075916 | A1 | 3/2018 | Lee |
| 2018/0137925 | A1 | 5/2018 | Nam et al. |
| 2019/0198117 | A1 | 6/2019 | Yu |
| 2019/0294367 | A1 | 9/2019 | Takada et al. |
| 2019/0333590 | A1 | 10/2019 | Lee |
| 2019/0348122 | A1 | 11/2019 | Ko et al. |
| 2019/0371394 | A1 | 12/2019 | Yang et al. |
| 2020/0118630 | A1 | 4/2020 | Lin et al. |
| 2020/0168276 | A1 | 5/2020 | Yang |
| 2020/0395372 | A1 | 12/2020 | Seo et al. |
| 2020/0402564 | A1 | 12/2020 | Piccardi |
| 2021/0027848 | A1 | 1/2021 | Seo |
| 2021/0125674 | A1 | 4/2021 | Chen et al. |
| 2021/0272637 | A1 | 9/2021 | Chen et al. |

FOREIGN PATENT DOCUMENTS

| | | |
|---|---|---|
| CN | 103490008 A | 1/2014 |
| CN | 107170746 A | 9/2017 |
| CN | 108140415 A | 6/2018 |
| CN | 109065091 A | 12/2018 |
| CN | 109390012 A | 2/2019 |
| CN | 109584938 A | 4/2019 |
| CN | 109887926 | 6/2019 |
| CN | 109979515 A | 7/2019 |
| JP | 2019-117679 A | 7/2019 |
| JP | 2019-527449 A | 9/2019 |
| KR | 10-2018-0021964 A | 3/2018 |
| KR | 10-2018-0054023 A | 5/2018 |
| KR | 10-2019-0119149 A | 10/2019 |

OTHER PUBLICATIONS

International Preliminary Report on Patentability directed to related International Patent Application No. PCT/CN2019/112728, issued Apr. 26, 2022; 4 pages.
Kang et al., "Effects of Lateral Charge Spreading on the Reliability of TANOS (TaN/AlO/SiN/Oxide/Si) NAND Flash Memory," 45th Annual International Reliability Physics Symposium, 2007, 4 pages.
Choi et al., "Comprehensive evaluation of early retention (fast charge loss within a few seconds) characteristics in tube-type 3-D Nand Flash Memory," 2016 Symposium on VLSI Technology Digest of Technical Papers, 2016, 2 pages.
Aritome, "Principle of NAND Flash Memory," Nand Flash Memory Technologies, First Edition, Chapter 2, John Wiley & Sons, Inc., 2016, 10 pages.
Micheloni et al., 3D Flash Memories, Springer Netherlands, 2016, excerpts, 15 pages.
Liu et al., "Electric Field Induced Nitride Trapped Charge Lateral Migration in a SONOS Flash Memory," IEEE Electron Device Letters, vol. 38, Issue 1, Jan. 2017, 4 pages.
Silvagni, "3D Nand Flash Based on Planar Cells," Computers, vol. 6, Issue 28, Oct. 2017, p. 2.
Micheloni et al., "Inside Solid State Drives (SSDs)," Second Edition, Springer Series in Advanced Microelectronics 37, 2018, 495 pages.
Wu et al., "Multiscale simulation of lateral charge loss in Si3N4 3D Nand flash based on density functional theory," Journal of Physics D: Applied Physics, vol. 52, Jul. 24, 2019, 7 pages.
European Patent Office, "Communication under Rule 71(3) EPC," issued in connection with European Patent Application No. 23 181 351.0 - 1211, mailed on Dec. 6, 2024, 70 pages.
Korean Intellectual Property Office, "Notice of Final Rejection," issued in connection with Korean Patent Application No. 10-2024-7009482, mailed on Feb. 26, 2025, 8 pages. [English language machine translation included.].

* cited by examiner

METHOD FOR READING THREE-DIMENSIONAL FLASH MEMORY

CROSS-REFERENCE TO RELATED APPLICATIONS AND INCORPORATION BY REFERENCE

This application is a continuation of U.S. patent application Ser. No. 17/324,877 filed on May 19, 2021 and titled "Method for Reading Three-Dimensional Flash Memory," which is a continuation of U.S. patent application Ser. No. 16/729,838 filed on Dec. 30, 2019, issued on Jun. 22, 2021 as U.S. Pat. No. 11,043,279 and titled "Method for Reading Three-Dimensional Flash Memory," which claims priority to PCT/CN2019/112728 filed on Oct. 23, 2019, all of which are incorporated herein by reference in their entirety.

TECHNICAL FIELD

The present disclosure generally relates to the field of semiconductor technology, and more particularly, to a method for reading a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, memory cells can be programmed for data storage based on charge-trapping technology. The storage information of a memory cell depends on the amount of charge trapped in a storage layer. However, fast charges, i.e., charges trapped in shallow traps, can be easily lost. Therefore, the threshold voltage determining the stored information can be different between write and read operations. Accordingly, a read-prepare step is included in a read-verification operation after programming to remove the fast charges and verify the threshold voltage of the memory cell. Fast charge loss depending on the intrinsic de-trapping process in the storage layer can be long, making the read-verification operation inefficient. Therefore, a need exists for a method to accelerate fast charge loss so that threshold voltage or storage information of the memory cell can be verified or read more accurately and efficiently.

BRIEF SUMMARY

Embodiments of a method for conducting read-verification operation of a memory cell in a three-dimensional (3D) memory device is described in the present disclosure.

One aspect of the present disclosure provides a method for conducting a read-verification operation on a target memory cell in a three-dimensional (3D) memory device. The method includes removing fast charges of the target memory cell at a read-prepare step, which includes applying a prepare voltage ($V_{prepare}$) on an unselected top select gate (Unsel_TSG) of an unselected memory string, applying a first off voltage ($V_{off}$) on a selected word line (Sel_WL) associated with the target memory cell, and applying a pass voltage ($V_{pass}$) on an unselected word line (Unsel_WL). The method also includes measuring a threshold voltage of the target memory cell at a sensing step.

In some embodiments, the method further includes applying a top select gate voltage ($V_{tsg}$) on a selected top select gate (Sel_TSG) of a selected memory string containing the target memory cell, and applying a lower select gate voltage ($V_{lsg}$) on a lower select gate (LSG) of the selected memory string containing the target memory cell.

In some embodiments, applying the top select gate voltage ($V_{tsg}$) includes electrically connecting the selected memory string to a bit line. In some embodiments, applying the lower select gate voltage ($V_{lsg}$) includes electrically connecting the selected memory string to an array common source.

In some embodiments, applying the top select gate voltage ($V_{tsg}$) includes applying a voltage between 4V to 7V. In some embodiments, applying the lower select gate voltage ($V_{lsg}$) includes applying a voltage between 4V to 7V.

In some embodiments, applying the pass voltage ($V_{pass}$) includes applying the pass voltage with a delay period after the selected top select gate (Sel_TSG) and the lower select gate (LSG) are at the top select gate voltage ($V_{tsg}$) and the lower select gate voltage ($V_{lsg}$), respectively.

In some embodiments, measuring the threshold voltage includes applying a read voltage ($V_{read}$) on the selected word line (Sel_WL). In some embodiments, applying the read voltage ($V_{read}$) includes applying a voltage between 0 to 2V. In some embodiments, applying the read voltage ($V_{read}$) includes applying a second off voltage on the unselected word line (Unsel_WL). In some embodiments, applying the second off voltage on the unselected word line (Unsel_WL) includes applying a 0V.

In some embodiments, applying the read voltage ($V_{read}$) includes applying the read voltage ($V_{read}$) when a voltage of the unselected top select gate (Unsel_TSG) is higher than a threshold voltage of an unselected memory cell. In some embodiments, applying the read voltage ($V_{read}$) includes applying the read voltage ($V_{read}$) when a voltage of the unselected top select gate (Unsel_TSG) equals to a threshold voltage of an unselected memory cell. In some embodiments, applying the read voltage ($V_{read}$) includes applying the read voltage ($V_{read}$) when a voltage of the unselected top select gate (Unsel_TSG) is lower than a threshold voltage of an unselected memory cell.

In some embodiments, applying the prepare voltage ($V_{prepare}$) includes applying a voltage between 4V to 7V. In some embodiments, applying the first off voltage ($V_{off}$) includes applying a 0V. In some embodiments, applying the pass voltage ($V_{pass}$) includes pass applying a voltage between 5V to 9V.

In some embodiments, removing the fast charges includes removing the fast charges from a storage layer of the target memory cell of a selected memory string, wherein the selected memory string includes a channel hole penetrating vertically through a film stack of alternating conductive and dielectric layers, a core filling film in a center of the channel hole, and a memory film covering a sidewall of the channel hole. The selected memory string also includes a channel layer sandwiched between the memory film and the core filling film. In some embodiments, the memory film includes a barrier layer, the storage layer and a tunneling layer.

In some embodiments, removing the fast charges includes removing electrical charges from shallow traps in the storage layer of the target memory cell.

In some embodiments, removing the fast charges includes removing the fast charges from the target memory cell to a neighboring unselected memory cell.

In some embodiments, conducting the read-verification operation comprises conducting the read-prepare step and conducting a failed bit count in parallel.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

Figure 1:
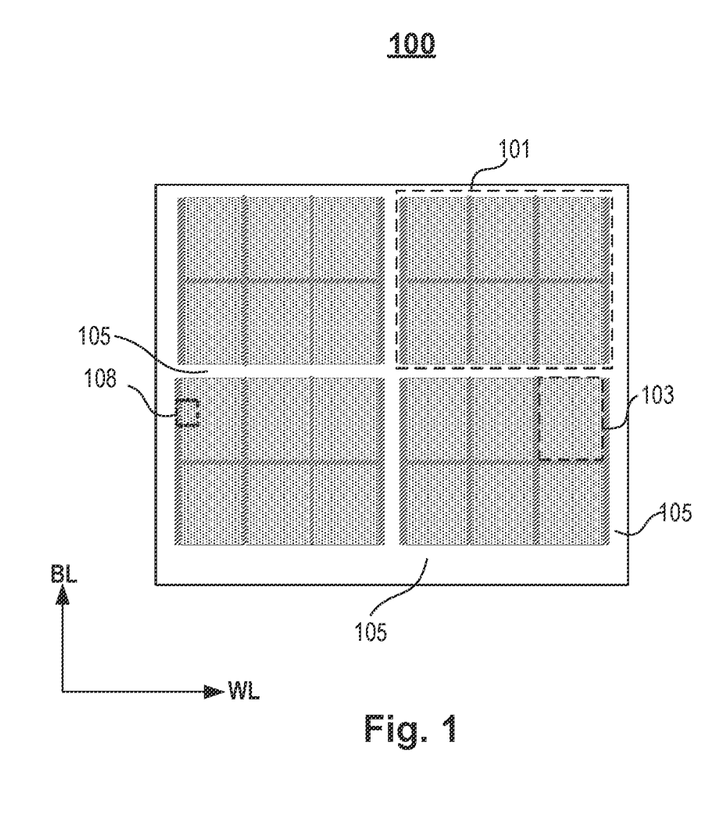
FIG. 1 illustrates a schematic top-down view of an exemplary three-dimensional (3D) memory die, according to some embodiments of the present disclosure.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
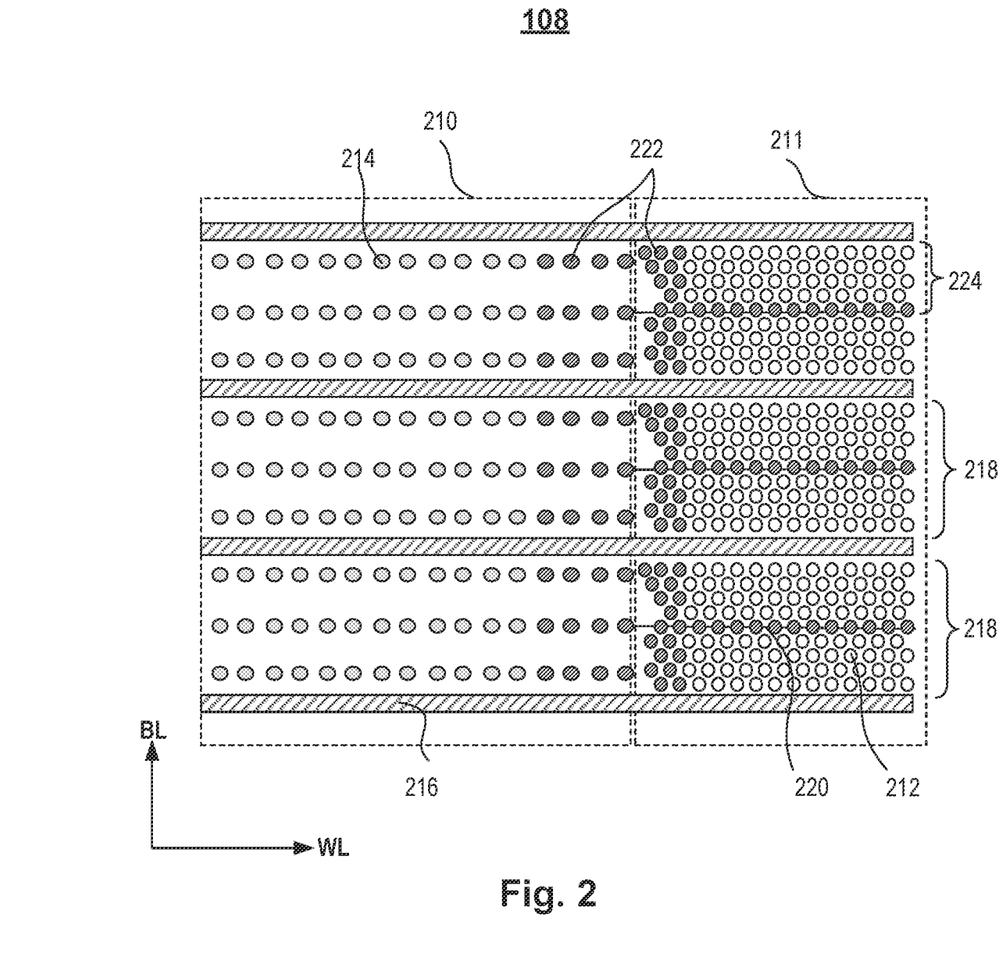
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
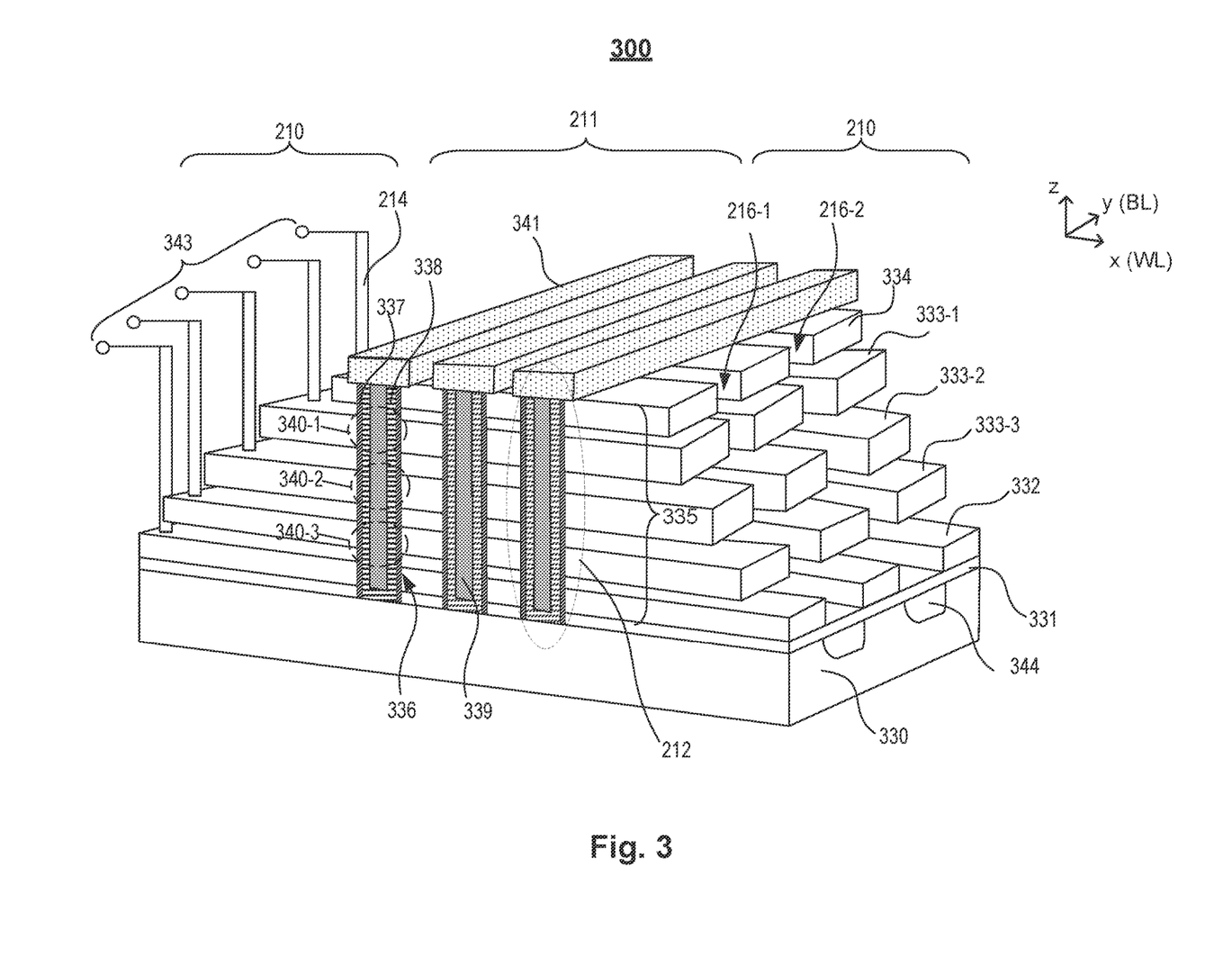
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

While floating gate memory cells has been traditionally utilized in flash memories, technology based on charge trapping has demonstrated more scaling ability and higher intrinsic reliability. Three-dimensional NAND using charge trapping technology has been developed for high density storage, where the storage information (e.g., threshold voltage $V_{th}$ of the memory cell) depends on the amount of charge trapped in a storage layer.

Figure 4A:
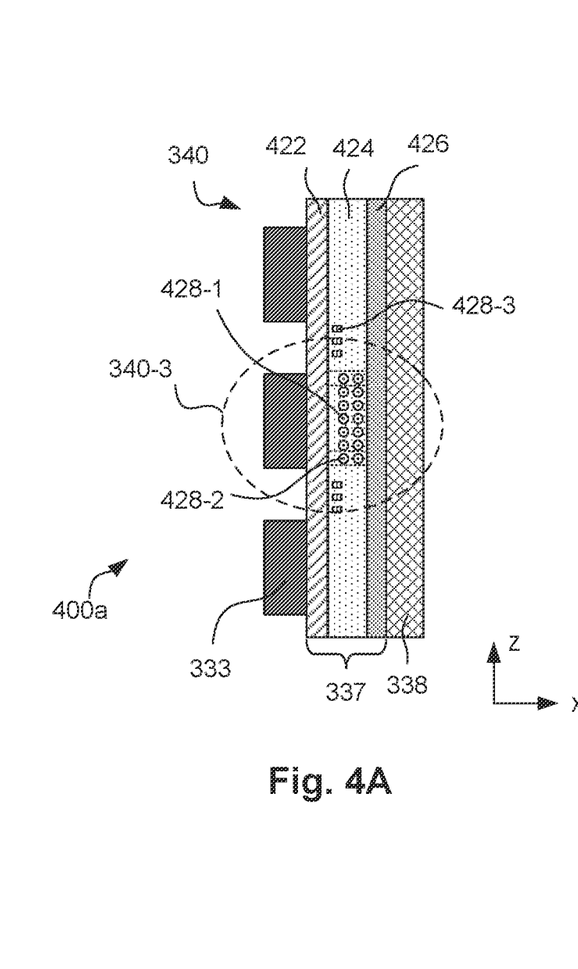
FIG. 4A illustrates a cross-sectional view of 3D memory cells, according to some embodiments of the present disclosure.

FIG. 4A illustrates a schematic cross-section of a 3D NAND memory 400a, which includes memory cells similar to the memory cell 340 in FIG. 3. The memory cell 340-3 includes a control gate (e.g., the control gate 333), a memory film (e.g., the memory film 337) and a channel layer (e.g., the channel layer 338, also referred to as the channel).

In a 3D NAND memory, the memory film 337 can be disposed on a sidewall of each channel hole 336 (illustrated in FIG. 3). In some embodiments, the memory film 337 can include a barrier layer 422, a storage layer 424, and a tunneling layer 426. The barrier layer 422 can be used to block the movement of electronic charges 428 between the control gate 333 and the storage layer 424. The barrier layer 422 can include silicon oxide and high dielectric constant (high-k) dielectrics, for example, aluminum oxide. The storage layer 424 can be used to store electronic charges 428 and can include silicon nitride. The storage and/or removal of charges in the storage layer 424 can impact the on/off state and/or a conductance of the channel layer 338. The tunneling layer 426 can be used to control the tunneling of electronic charges 428 (electrons or holes) between the channel layer 338 and the storage layer 424. The tunneling layer 426 can be silicon oxide, silicon nitride, silicon oxynitride, or any combination thereof. In a 3D NAND memory, the channel layer 338 can be disposed on a sidewall of the memory film 337 in the channel hole 336 (in FIG. 3.) The channel layer 338 can include amorphous silicon, polycrystalline silicon, and/or monocrystalline silicon.

Figure 4B:
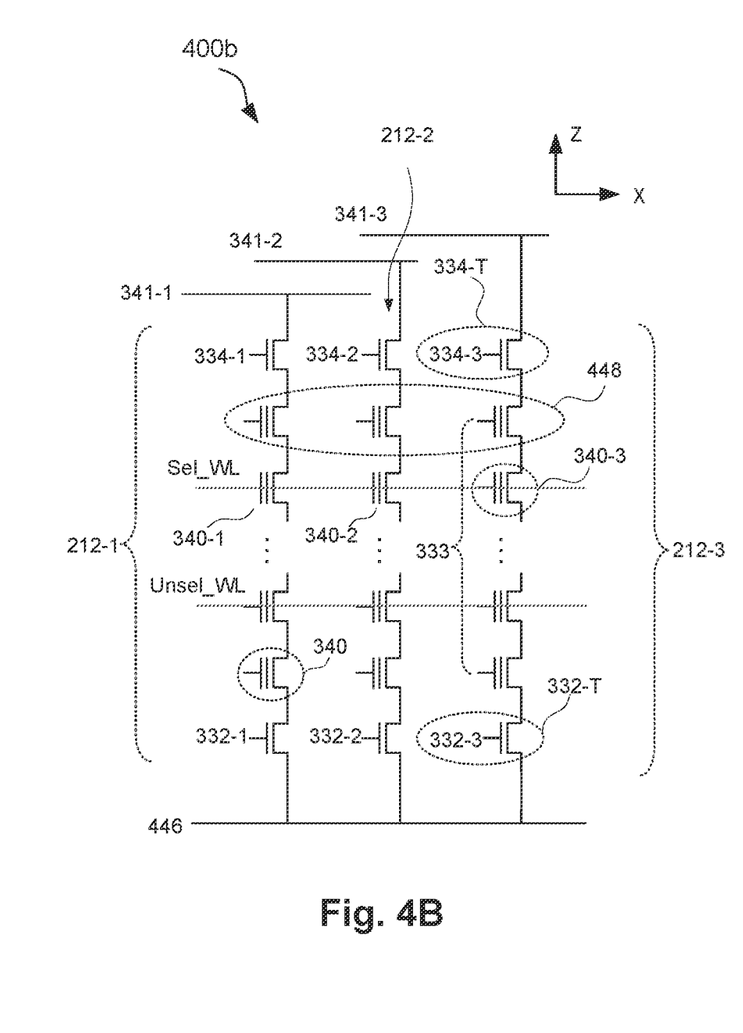
FIG. 4B illustrates a schematic diagram of a 3D memory array, according to some embodiments of the present disclosure.

FIG. 4B shows a schematic circuit diagram of a 3D memory array 400b. As described previously, the 3D memory array 400b includes a plurality of memory strings 212, each memory string 212 having a plurality of stacked memory cells 340. The memory string 212 also includes at least one field effect transistor (e.g., MOSFET) at each end, which is controlled by the lower select gate (LSG) 332 and the top select gate (TSG) 334, respectively. And the two respective transistors are referred to as lower and top select transistors 332-T and 334-T. The stacked memory cells 340 can be controlled by the control gates 333, where the control gates 333 are connected to word lines (not shown) of the 3D memory array 400b. The drain terminal of the top select transistor 334-T can be connected to the bit lines (e.g., the bit line 341-1, 341-2, 341-3, etc.), and the source terminal of the lower select transistor 332-T can be connected to the doped source line region 344 (see FIG. 3), from where an array common source (ACS) 446 can be formed. The array common source 446 can be shared by the memory strings 212 in an entire memory block, and is also referred to as the common source line.

Referring to FIGS. 4A and 4B, in a NAND memory, read and write operations can be performed in a memory page, for example memory page 448, which includes memory cells sharing the same word line. In a NAND memory, each memory cell can be in an erased state or a programmed state. Initially, all memory cells in a block can be reset to the erased state as logic "1" by applying, for example, a negative voltage between the control gates 333 and source terminals of the memory cells (e.g., the array common source 446) such that all the electronic charges 428 in the storage layers 424 of the memory cells can be removed. At the erased state, the threshold voltage $V_{th}$ of the memory cells 340 can be reset to the lowest value, and the corresponding current flowing through the memory cells 340 between the source terminal (e.g., the array common source 446) and the drain terminal (e.g., the bit lines 341) can be at the highest level for a given bias on the word lines.

During programming (i.e., writing), a high positive voltage pulse (e.g., 12V to 18V) can be applied on the control gate 333 such that electronic charges 428 (e.g., electrons) can be injected into the storage layer 424 of the memory cell 340, where the electronic charges 428-1 and 428-2 can be randomly captured by deep and shallow traps, respectively. After programming, the threshold voltage $V_{th}$ of the memory cell 340 can be raised to a higher value than that of the erased state. At a higher threshold voltage $V_{th}$, the current flowing through the source and drain terminals of the memory cell can be at a reduced level for a given bias on the word lines. By measuring (i.e., reading) the memory cell current, the threshold voltage $V_{th}$ and thereby the state of the memory cell 340 can be determined accordingly.

With multi-level-cell or triple-level-cell technology, each memory cell 340 can have multiple programed states, i.e., multiple values of threshold voltages $V_{th}$. After every programming pulse, a read-verification operation can be performed to check the state of the memory cell. As such, each memory cell 340 can store multiple bits, leading to significant increase of storage capacity.

For memory cell 340 in a programmed state, electronic charges 428-1 and 428-2 located within the proximity of control gate 333 can affect threshold voltage $V_{th}$ of the memory cell 340. The electronic charges 428-3 located beyond the electric field from control gate 333, and therefore have little impact on the threshold voltage $V_{th}$ of the memory cell. In addition, electronic charges 428-2 captured by shallow traps in the storage layer 424 can be easily de-trapped, and can thereby cause initial threshold-voltage ($V_{th}$) shift (IVS) during storage period. This process is also referred to as fast charge loss. For programmed state at higher threshold voltage $V_{th}$, IVS can be larger due to larger amount of electronic charges injected to the storage layer, which results in larger number of electronic charges 428-2 captured by shallow traps (also referred to as fast charges).

Due to IVS, the programmed state immediately after writing cannot reflect the target threshold voltage $V_{th}$ of the memory cell 340 in real applications. Applying the fake high threshold voltage $V_{th}$ can cause high bit-error-rate in the memory. Therefore, it is necessary to de-trap and remove fast charges prior to read operation such that the $V_{th}$ distribution profile of each programmed state can be more accurately determined.

Figure 5:
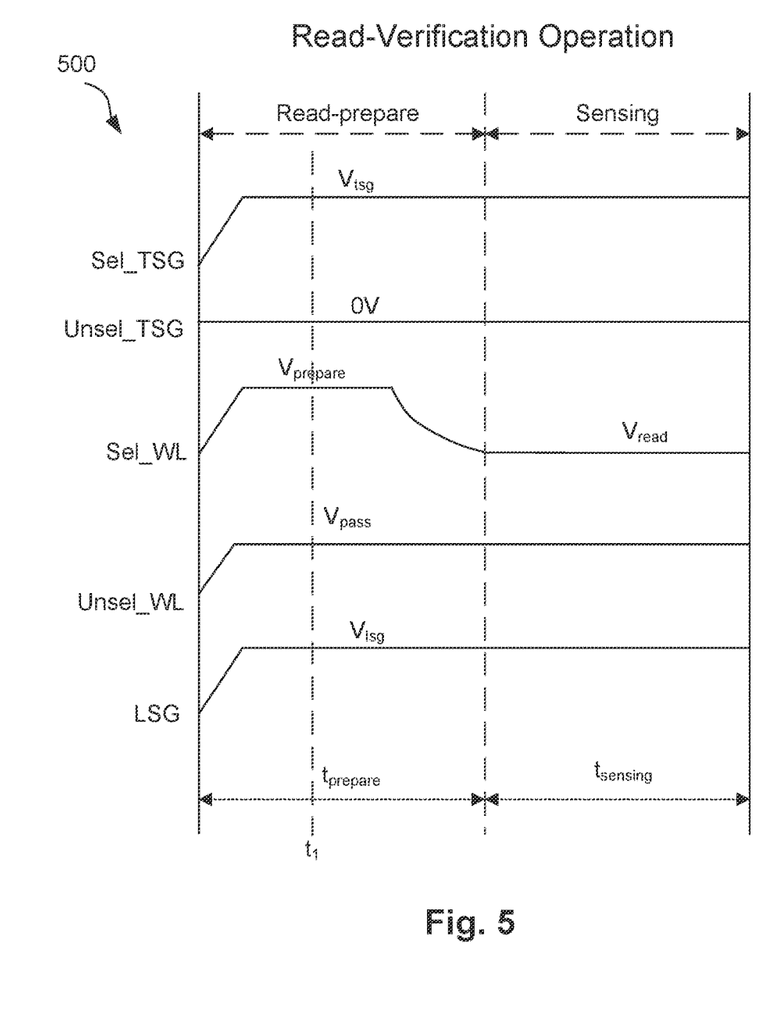
FIG. 5 illustrates a timing diagram of a read-verification operation with a prepare voltage (pre-pulse) applied on a selected word line, according to some embodiments of the present disclosure.

FIG. 5 illustrates a timing diagram of a read-verification operation 500 with a prepare voltage (pre-pulse) applied on a selected word line, according to some embodiments of the present disclosure. The read-verification operation 500 can reduce read disturb for unselected memory strings in a 3D NAND memory. Read disturb can occur when the threshold voltage $V_{th}$ (i.e., the programmed state) of an unselected memory cell is changed or disturbed during read or read-verification of a selected memory cell. In some embodiments, the read-verification operation 500 includes two steps, i.e., a read-prepare step and a sensing step, having duration of $t_{prepare}$ and $t_{sensing}$, respectively. The timing diagram of a selected top select gate (Sel_TSG), unselected top select gates (Unsel_TSG), a selected word line (Sel_WL), unselected word lines (Unsel_WL) and the lower select gate (LSG) are shown in FIG. 5.

The read-verification operation 500 starts with the read-prepare step. The TSG 334 and the LSG 332 of a selected memory string, for example TSG 334-3 and LSG 332-3 of a selected memory string 212-3 in FIG. 4B, can be applied with a top select gate voltage $V_{tsg}$ and a lower select gate voltage $V_{lsg}$. A corresponding top select transistor 334-T and a lower select transistor 332-T of the selected memory string 212-3 can be switched on. The top and lower select gate voltages $V_{tsg}$ and $V_{lsg}$ can be in a range between 4V to 7V. Accordingly, a current path through the stacked memory cells 340 can be established for the selected memory string 212-3. For example, the current flowing through the selected memory string 212-3 can be detected from the bit line 341-3 and the array common source 446 that are electrically connected with the selected memory string 212-3.

For the read-verification operation 500, the TSG of unselected memory strings (Unsel-TSG), for example TSG 334-1 of memory string 212-1 in FIG. 4B, can be applied with a first off voltage ($V_{off}$), for example 0V, to switch off a corresponding top select transistor 334-T. Current path between the unselected memory strings 212-1 and bit lines 341-1 can be disconnected. Therefore, the channel of selected memory string 212-3 and unselected memory strings 212-1 can be electrically isolated.

It is noted that there is a delay for the voltages to ramp up during the read-prepare step. This delay can be caused by parasitic capacitors and resistors, and is well-known for a person skilled in the art. Although a memory string is selected and used as an example to describe read-verification operation herein, it is noted that a plurality of memory strings, for example, a memory finger can be selected and operated in a similar way.

Referring again to FIGS. 4A, 4B and 5, to verify a target memory cell 340-3 in the selected memory string 212-3, a selected word line (e.g., Sel_WL in FIG. 4B) can be applied with a prepare voltage $V_{prepare}$ (also referred to as pre-pulse), while other word lines not selected (e.g., Unsel_WL in FIG. 4B) can be applied with a pass voltage $V_{pass}$. The selected word line are electrically connected to the control gate 333 of the target memory cell 340-3. The prepare voltage $V_{prepare}$ can be in a range between 4V to 7V, and the pass voltage $V_{pass}$ can be in a range between 5V to 9V. The pass voltage $V_{pass}$ can be higher than the highest threshold voltage of the programmed states such that the memory cells on the selected memory string 212-3 can be fully switched on. When the prepare voltage $V_{prepare}$ is applied on the selected word line Sel_WL, the target memory cell 340-3 can also be switched on. Therefore, at time $t_1$, the top and lower select transistors 334-T and 332-T, and all memory cells 340 of the selected memory string 212-3 are switched on. Current flows between the bit line 341-3 and the array common source 446 via the channel layer of the selected memory string 212-3. As current flowing through the channel layer 338 forming a conductive path, de-trapped fast charges 428-2 from the storage layer 424 can be removed through the conductive path. However, fast charge loss can be a slow process, which is shown in the timing diagram of the selected word line (Sel_WL) in FIG. 5.

In some embodiments, fast charges 428-2 can also be removed by thermal annealing or by implementing soft erase with a low negative voltage on the control gate. However, the read-prepare step generally can take a long time and thus impact the efficiency of the read-verification operation. Therefore, a need exists for a read-verification operation to provide accelerated fast charge loss and shorten read-prepare step.

In some embodiments, the read-prepare step can reduce read disturb for the unselected memory strings, for example, memory strings 212-1 and 212-2 in FIG. 4B. As described above, the unselected top select gates (Unsel_TSG) for unselected memory strings (e.g., TSG 334-1 of memory string 212-1) can be applied with the first off voltage ($V_{off}$), e.g., 0V, to switch off the corresponding top select transistors 334-T and disconnect from the bit lines (e.g., bit line 341-1) as depicted in FIG. 4B. In some embodiments, the lower select gates (LSG) of the unselected memory strings (e.g., LSG 332-1) are applied with the lower select gate voltage $V_{lsg}$ such that the lower select transistors 332-T are switched on. By applying the prepare voltage $V_{prepare}$ on the selected word line (Sel_WL), corresponding memory cells (e.g., memory cells 340-1, 340-2, 340-3, etc.) can be switched on if the prepare voltage $V_{prepare}$ is selected to be higher than the threshold voltages of the programmed states of the memory cells. In this example, the channel of the memory cells of the unselected memory strings (e.g., memory cells 340-1) can be electrically connected to the array common source 446 to maintain at a predetermined potential, e.g., ground.

In an example that the prepare voltage $V_{prepare}$ is not applied on the selected word line (Sel_WL), the memory cells corresponding to the selected word line (e.g., the memory cell 340-1 of memory string 212-1) may not be fully switched on (e.g., a voltage applied on the selected word line is lower than the threshold voltage $V_{th}$ of the memory cell 340-1). Upper memory cells, i.e., memory cells located between the bit line (e.g., bit line 341-1) and the selected word line (Sel_WL) of the unselected memory string (e.g., memory string 212-1), can have floating channels, where the channel layer is not electrically connected to the bit lines 341 or the common array source 446. Channel potential of the upper memory cells of the unselected memory string (e.g., memory string 212-1) can vary randomly. Memory cells with floating channel can suffer charge loss due to an unknown electrical field between the control gate 333 and the channel layer 338 (see FIG. 4A). The trapped charges 428 and thereby the threshold voltages $V_{th}$ (i.e., programmed states) of the memory cells can be changed or disturbed, where the change can be significant with the increased number of reading operation. By introducing the read_prepare step prior to the sensing step, as described previously, read disturb on the unselected memory strings can be reduced.

After the read_prepare step, the voltage bias on the selected word line (Sel_WL) can be reduced from the prepare voltage $V_{prepare}$ to a read voltage $V_{read}$ to sense (i.e., read or measure) the threshold voltage $V_{th}$ of the target memory cell. The read voltage $V_{read}$ can be in a range between 0V to 2V. For the target memory cell programmed with threshold voltage $V_{th}$ lower than the read voltage $V_{read}$, the target memory cell can be switch on and form a conductive path in the channel layer 338. If the threshold voltage $V_{th}$ is higher than the read voltage $V_{read}$, the channel of the target memory cell is switched off. The programmed state of the target memory cell can be determined accordingly. It is noted that the transition period from the prepare voltage $V_{prepare}$ to the read voltage $V_{read}$ is a slow process due to parasitic capacitance and resistance as well as slow de-trapping process of fast trap loss. The sensing step can start after the Sel_WL reach the read voltage $V_{read}$, which increases the overall duration $t_{prepare}$ of read-prepare step.

Figure 6:
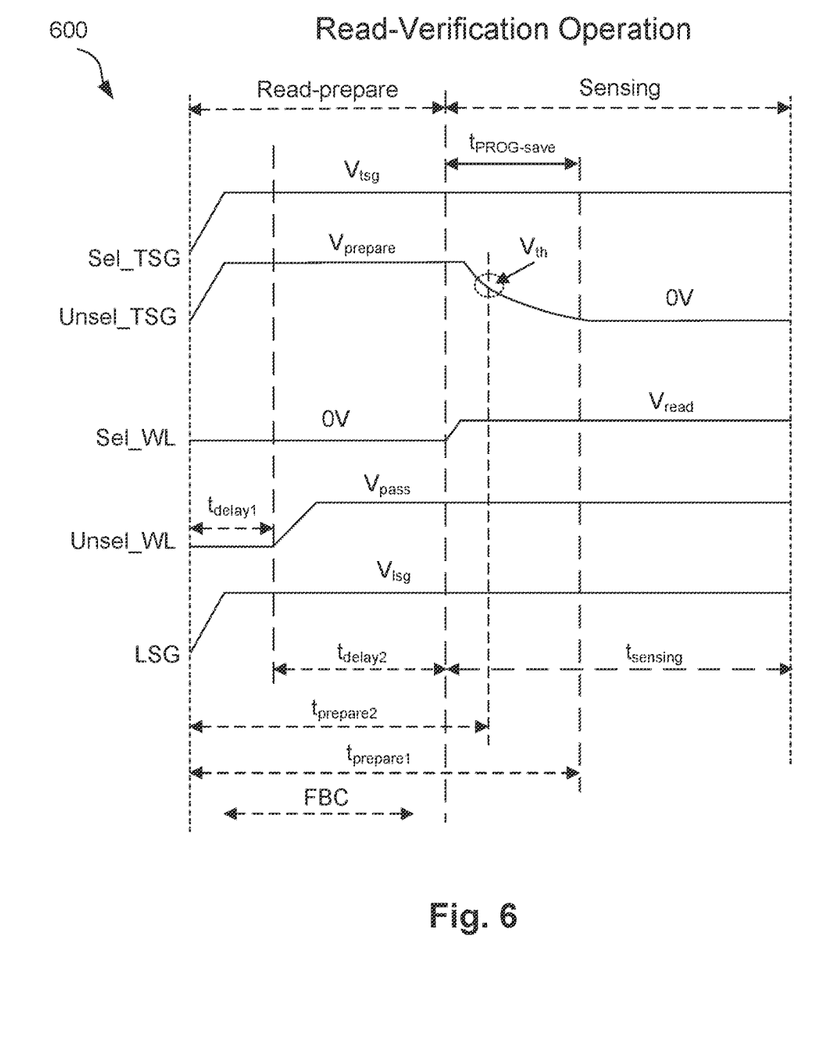
FIGS. 6-8 illustrate timing diagrams of read-verification operations with accelerated fast charge loss, according to some embodiments of the present disclosure.

FIG. 6 illustrates a read-verification operation 600 designed to accelerate fast charge loss in a three-dimensional flash memory, according to some embodiments of the present disclosure. The read-verification operation 600 also includes the read-prepare step and the sensing step. During the read-prepare step of the read-verification operation 600, the Sel_TSG and the LSG can be applied with the top and lower select gate voltages $V_{tsg}$ and $V_{lsg}$, respectively, to switch on the top and lower select transistors 334-T and 332-T (in FIG. 4B), similar to those used in the read-verification operation 500 in FIG. 5. However, unlike the read-verification operation 500, the Unsel_TSG of the read-verification operation 600 is applied with the prepare voltage $V_{prepare}$ during the read-prepare step. Accordingly, the selected and unselected memory strings can all be electrically accessed from the bit line 341 and the array common source 446.

In some embodiments, during the read-prepare step of the read-verification operation 600, the selected memory cell can be switched off by applying a second off voltage, e.g., 0V on the selected WL (i.e., Sel_WL). The unselected memory cells (i.e., Unsel_WL) can be switched on with the pass voltage $V_{pass}$ after a delay period $t_{delay1}$. During the delay period $t_{delay1}$, all select transistors controlled by Sel_TSG, Unsel_TSG and LSG are turned on with applied voltages $V_{tsg}$, $V_{prepare}$ and $V_{tsg}$ and thus the channel of the memory string 212 can be electrically connected to the bit line 341 and the array common source 446 (shown in FIG. 4B), and can be maintained at a potential adjustable by a voltage of the bit line 341. When the Unsel_WL is applied with the pass voltage $V_{pass}$, all the unselected memory cells of the selected memory string are switched on. Therefore, the channel of the selected memory cell can be electrically connected to the bit line 341 through upper memory cells and to the array common source 446 through the lower memory cells. The channel of the selected memory cell can thereby be held at a potential adjustable by the voltage of the bit line 341 and the array common source 446.

In some embodiments, the delay period $t_{delay1}$ is implemented such that the channel of the memory string 212 is not electrically isolated from the bit line 341 or the array common source 446 before Unsel_WL can be ramped up from 0V to the pass voltage $V_{pass}$. Referring to FIG. 4B and FIG. 6, if the Unsel_WL is applied with the pass voltage $V_{pass}$ before the Sel_TSG reach the top select gate voltage $V_{tsg}$ or Unsel_TSG reach the prepare voltage $V_{prepare}$, the top select transistors are off and upper portion of the channel layer 338 that is located close to the bit line 341 becomes a floating node. More specifically upper memory cells located between the bit line and the selected memory cell can have a floating channel potential. Similarly, if the Unsel_WL is applied with the pass voltage $V_{pass}$ before the LSG ramps up to the lower select gate voltage $V_{lsg}$ to switch on the lower select transistor, lower portion of the channel layer 338 that is located close to the array common source 446 becomes a floating node. More specifically lower memory cells located between the array common source and the selected memory cell can have a floating channel potential. When floating, channel potential of the memory cells can be boosted by the pass voltage Vass $V_{pass}$ of the Unsel_WL through coupled capacitance. The boosted channel potential of the unselected memory cells can influence the channel potential of the neighboring selected memory cell and influence fast charge removing process. By introducing the delay period $t_{delay1}$, the aforementioned self-boosting effect or read disturb on the selected or unselected memory cell can be avoided.

In some embodiments, the read-prepare step also includes a delay period $t_{delay2}$, a duration between ramping up the pass voltage $V_{pass}$ of Unsel_WL and the read voltage $V_{read}$ of the Sel_WL. During the delay period $t_{delay2}$, the voltage of Sel_WL is kept at 0V while the voltage of Unsel_WL is raised from 0V to the pass voltage $V_{pass}$. As discussed previously, the pass voltage $V_{pass}$ is applied on the Unsel_WL after the top and lower select transistors are switched on with applied voltages $V_{tsg}$, $V_{prepare}$ and $V_{lsg}$ on Sel_TSG, Unsel-TSG and LSG, respectively. As such, the selected memory cell is switched off while unselected memory cells are switched on. Referring back to FIG. 4A, while the selected memory cell 340-3 is switched off, the neighboring unselected memory cells 340 are switched on. Between the selected memory cell 340-3 with a 0V gate bias and the neighboring unselected memory cells 340 with a gate bias of the pass voltage $V_{pass}$, an electric field parallel to the channel can be established accordingly. The electric field between the neighboring selected and unselected word line can also extend into the charge storage layer 424, the tunneling layer 426 and the channel layer 338. The electric field can generate an electric force on the fast charges 428-2 captured in the storage layer 424. The electric force can de-trap the fast charges 428-2 from the shallow traps, pull them towards the neighboring unselected memory cells. The fast charges can then be recombined with charges of opposite sign or be removed through the conductive path established in the channel of the unselected memory cells. As a result, fast charges 428-2 in the storage layer 424 of the selected memory cell 340-3 can be removed through electric field from neighboring unselected memory cells.

Referring again to FIG. 6, the duration of the read-prepare step of the read-verification operation 600 includes the sum of the delay period $t_{delay1}$ and $t_{delay2}$. Both $t_{delay1}$ and $t_{delay2}$ can be pre-determined values.

In some embodiments, after the read-prepare step, the read voltage $V_{read}$ is applied on the Sel_WL to start the sensing step and BL pre-charge. The sensing step has a duration of $t_{sensing}$, which can also be a predetermined value. During the sensing step, a voltage of 0V is applied on the Unsel_TSG, which switches off the unselected top select gates and electrically isolates the channel of selected memory string from the channel of unselected memory strings. Similar to the read-verification operation 500 (in FIG. 5), the ramping-down process from the prepare voltage $V_{prepare}$ to 0V has a delay time, resulting from parasitic resistance and capacitance of the 3D memory structure. To switch on the memory cells, the prepare voltage $V_{prepare}$ can be set higher than the threshold voltage $V_{th}$ of the memory cell. When the voltage of Unsel_TSG ramping down from the prepare voltage $V_{prepare}$ to below $V_{th}$, the top select transistors of the unselected memory strings are switched off accordingly. The read-verification operation 600 has a duration $t_{prepare2}$ from the beginning of the read-prepare step to the moment that the Unsel_TSG drops to below $V_{th}$. In the other words, the duration $t_{prepare2}$ is the minimum time requirement for turning off the Unsel_TSG in the read-verification operation 600. The read-verification operation 600 has a duration $t_{prepare1}$ from the beginning of the read-prepare step to the moment that the Unsel_TSG reaches 0V. For read-verification operation 600, duration of the read-prepare step, i.e., $t_{delay1}+t_{delay2}$ is less than $t_{prepare2}$. The sensing step and BL pre-charge start when Unsel_TSG is above $V_{th}$ and the unselected top select transistor is still on. This operation can provide a minimum time used for the read-prepare step, although more power is consumed. The time saved $t_{PROG\text{-}save}$ is a difference between $t_{prepare1}$ and $t_{delay1}+t_{delay2}$.

Figure 7:
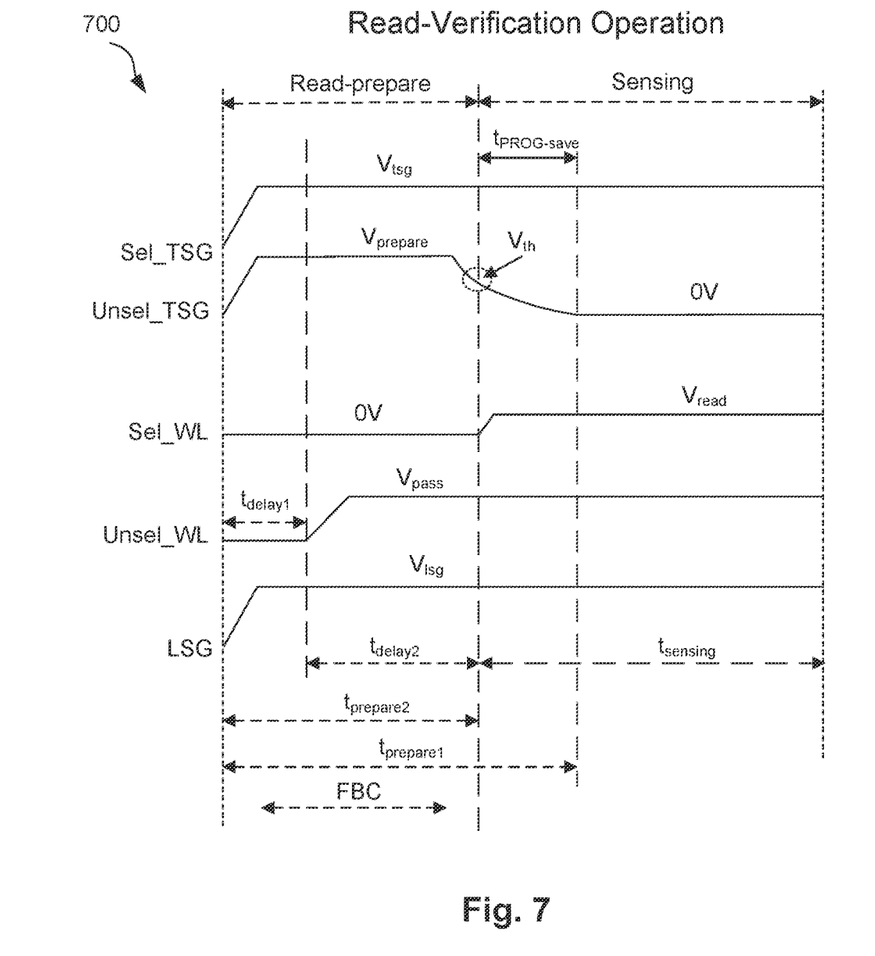

FIG. 7 illustrates a read-verification operation 700 designed to accelerate fast charge loss in a three-dimensional flash memory, according to some embodiments of the present disclosure. The read-verification operation 700 is similar to the read-verification operation 600, except having a duration of the read-prepare step (i.e., $t_{delay1}+t_{delay2}$) equals $t_{prepare2}$, the minimum time requirement for turning off the Unsel_TSG. In the read-verification operation 700, the sensing step and BL pre-charge start when the unselected top select transistors are just turned off. Still, the time saved $t_{PROG\text{-}save}$ can be expressed as the difference between $t_{prepare1}$ and $t_{delay1}+t_{delay2}$, as shown in FIG. 7. This operation can be sped-up, and thus improved, without consuming more power.

Figure 8:
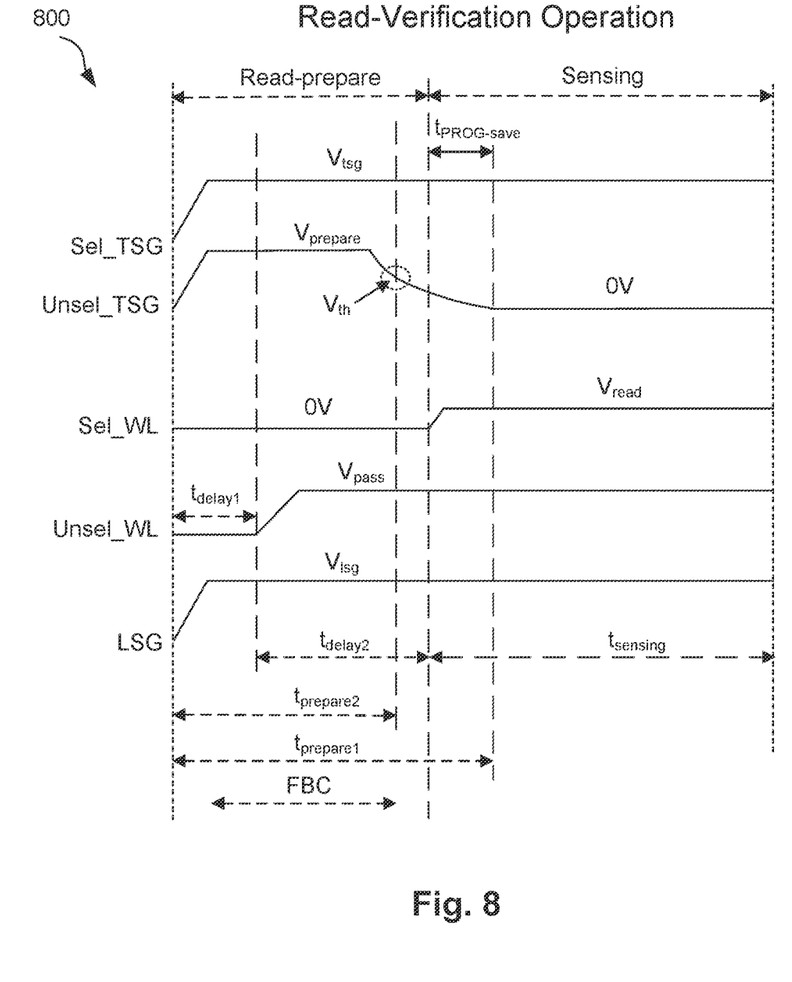

FIG. 8 illustrates a read-verification operation 800 designed to accelerate fast charge loss in a three-dimensional flash memory, according to some embodiments of the present disclosure. The read-verification operation 800 is similar to the read-verification operation 600, except having a duration of the read-prepare step (i.e., $t_{delay1}+t_{delay2}$) more than $t_{prepare2}$, the minimum time requirement for turning off the Unsel_TSG. In the read-verification operation 800, the sensing step and BL pre-charge start after the unselected top select transistors are turned off. The time saved $t_{PROG\text{-}save}$ can also be expressed as the difference between $t_{prepare1}$ and $t_{delay1}+t_{delay2}$, as shown in FIG. 8. This operation can allow more time for removing fast charges.

As described above, accelerating fast charge loss in a 3D NAND flash memory can be achieved by applying the prepare voltage $V_{prepare}$ on Unsel_TSG, the pass voltage $V_{pass}$ on the Unsel_WL, and 0V on the Sel-WL at the read-prepare step. The threshold voltage $V_{th}$ of the target memory cell, associated with the Sel_WL, can be stabilized before the sensing step such that the verified storage data can be more reliable.

In addition, the read-verification operation described above can greatly reduce the time required at the read-prepare step. The fast charges can be removed by electric field generated between Sel_WL and neighboring Unsel_TSG. After fast charge removal, the sensing step starts when the voltage on Sel_WL is switched from 0V to the read voltage $V_{read}$, without the need to wait for the Unsel-TSG to ramp down from the prepare voltage $V_{prepare}$ to 0V. Therefore, the duration of read-prepare step can be shortened, i.e., $t_{delay1}+t_{delay2}<t_{prepare1}$, where $t_{PROG\text{-}save}=t_{prepare1}-t_{delay1}-t_{delay2}$ the time saved.

3D NAND flash memory with multi-level-cells typically uses an algorithm with incremental step pulses to program the memory cells. After every program pulse, a read-verification operation is performed to check the state of the memory cells. When the memory cell reaches the target state (i.e., target threshold voltage), the program will be stopped. In the meantime, the memory cells not programed to the target state are calculated towards failed bit count (FBC), where the FBC can be executed in parallel to the read-verification operation to save the time of the entire programming cycle. As shown in FIGS. 6-8, FBC operation can be performed in parallel with the read-prepare step. In some embodiments, duration of the FBC operation can be shorter than the duration of the read-prepare step, and the FBC operation can be incorporated within the read-prepare step starting at any suitable time. The failed memory cells can be programmed again to the target memory state accordingly.

In summary, the present disclosure provides a method for conducting a read-verification operation on a target memory cell in a three-dimensional (3D) memory device, where the method includes removing fast charges of the target memory cell at a read-prepare step and measuring a threshold voltage of the target memory cell at a sensing step. Removing the fast charges of the target memory cell includes applying a prepare voltage ($V_{prepare}$) on an unselected top select gate (Unsel_TSG) of an unselected memory string, applying a first off voltage ($V_{off}$) on a selected word line (Sel_WL) associated with the target memory cell, and applying a pass voltage ($V_{pass}$) on an unselected word line (Unsel_WL).

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for conducting a read-verification operation on a target memory cell in a three-dimensional (3D) memory device, comprising:
   applying, on an unselected top select gate of an unselected memory string, a prepare voltage during a first time period and an off voltage during a second time period;
   applying, on a selected word line associated with the target memory cell, a first voltage during the first time period; and applying, on an unselected word line, a pass voltage during the first time period and the second time period, wherein the first voltage is lower than the pass voltage, and the first time period is prior to the second time period.

2. The method of claim 1, further comprising:
applying, on a selected top select gate of a selected memory string containing the target memory cell, a top select gate voltage during the first time period and the second time period to switch on a top select transistor coupled to the selected top select gate; and
applying, on a selected lower select gate of the selected memory string containing the target memory cell, a lower select gate voltage during the first time period and the second time period to switch on a bottom select transistor coupled to the selected lower select gate.

3. The method of claim 2, further comprising applying, on the unselected word line, the pass voltage with a delay period, after the selected top select gate and the selected lower select gate of the selected memory string are at the top select gate voltage and the lower select gate voltage, respectively.

4. The method of claim 3, further comprising applying, on the unselected word line, the pass voltage with the delay period, after the unselected top select gate of the unselected memory string is at the prepare voltage.

5. The method of claim 2, further comprising applying, on an unselected lower select gate of the unselected memory string, the lower select gate voltage during the first time period and the second time period to switch on a further bottom select transistor coupled to the unselected lower select gate.

6. The method of claim 1, further comprising:
applying the prepare voltage on the unselected top select gate during the first time period to switch on a further top select transistor coupled to the unselected top select gate; and
applying the off voltage on the unselected top select gate during the second time period to switch off the further top select transistor.

7. The method of claim 6, further comprising, during the second time period, applying a read voltage on the selected word line and the pass voltage on the unselected word line.

8. The method of claim 7, further comprising applying the read voltage on the selected word line before the further top select transistor is switched off.

9. The method of claim 1, wherein the first voltage is approximately equal to the off voltage.

10. The method of claim 1, wherein the first voltage comprises the prepare voltage and the off voltage.

11. A method for conducting a read-verification operation on a target memory cell in a three-dimensional (3D) memory device, comprising:
applying, on a selected word line associated with the target memory cell, a prepare voltage during a first time period and a read voltage during a second time period, wherein the first time period is prior to the second time period;
applying, on an unselected word line, a pass voltage during the first time period and the second time period to switch on memory cells coupled to the unselected word line; and
applying, on a selected top select gate of a selected memory string containing the target memory cell, a top select gate voltage during the first time period and the second time period to switch on a top select transistor coupled to the selected top select gate.

12. The method of claim 11, further comprising applying the prepare voltage on the selected word line during the first time period to switch on memory cells coupled to the selected word line.

13. The method of claim 11, further comprising applying, on an unselected top select gate of an unselected memory string, an off voltage during the first time period and the second time period to switch off a further top select transistor coupled to the unselected top select gate.

14. The method of claim 11, further comprising applying, on an unselected top select gate of an unselected memory string, the prepare voltage during the first time period to switch on a further top select transistor coupled to the unselected top select gate and an off voltage during the second time period to switch off the further top select transistor.

15. The method of claim 14, further comprising applying the read voltage on the selected word line during the second time period before the further top select transistor is switched off.

16. A three-dimensional (3D) memory device, comprising:
memory strings, each memory string connected with a bit line and comprising memory cells connected in series, each memory cell addressable through a word line and the bit line of each memory string; and
a circuit for performing a read-verification operation on a target memory cell, the circuit configured to:
apply, on an unselected top select gate of an unselected memory string, a prepare voltage during a first time period and an off voltage during a second time period;
apply, on a selected word line associated with the target memory cell, a first voltage during the first time period; and
apply, on an unselected word line, a pass voltage during the first time period, wherein the first voltage is lower than the pass voltage, and the first time period is prior to the second time period.

17. The 3D memory device of claim 16, wherein the circuit is further configured to:
apply, on a selected top select gate of a selected memory string containing the target memory cell, a top select gate voltage during the first time period and the second time period to switch on a top select transistor coupled to the selected top select gate; and
apply, on lower select gates of the selected memory string and the unselected memory string, a lower select gate voltage during the first time period and the second time period to switch on bottom select transistors coupled to the lower select gates.

18. The 3D memory device of claim 17, wherein the circuit is further configured to apply, on the unselected word line, the pass voltage with a delay period, after the selected top select gate and the lower select gates are at the top select gate voltage and the lower select gate voltage, respectively, and after the unselected top select gate of the unselected memory string is at the prepare voltage.

19. The 3D memory device of claim 16, wherein the circuit is further configured to:
apply the prepare voltage on the unselected top select gate during the first time period to switch on a further top select transistor coupled to the unselected top select gate; and
apply the off voltage on the unselected top select gate during the second time period to switch off the further top select transistor, wherein the off voltage and the first voltage are approximately equal.

20. The 3D memory device of claim 19, wherein the circuit is further configured to, during the second time period, apply a read voltage on the selected word line and the pass voltage on the unselected word line, wherein the read voltage is applied on the selected word line before the further top select transistor is switched off.

* * * * *